US008928392B2

(12) United States Patent
Lee et al.

(10) Patent No.: US 8,928,392 B2
(45) Date of Patent: Jan. 6, 2015

(54) NO-POWER NORMALLY CLOSED ANALOG SWITCH

(75) Inventors: Tony Cheng Han Lee, South Portland, ME (US); Shawn Barden, Gorham, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/428,382

(22) Filed: Mar. 23, 2012

(65) Prior Publication Data

US 2012/0242396 A1    Sep. 27, 2012

Related U.S. Application Data

(60) Provisional application No. 61/465,800, filed on Mar. 23, 2011.

(51) Int. Cl.
*H03K 17/687* (2006.01)

(52) U.S. Cl.
USPC ............ 327/427; 327/430; 327/436; 327/437

(58) Field of Classification Search
USPC .................... 327/427, 430, 436, 437; 333/103
See application file for complete search history.

(56) References Cited

U.S. PATENT DOCUMENTS

| | | | | |
|---|---|---|---|---|
| 3,908,136 A | * | 9/1975 | Desperques-Volmier | 327/427 |
| 4,835,649 A | * | 5/1989 | Salerno | 361/18 |
| 5,539,610 A | * | 7/1996 | Williams et al. | 361/246 |
| 5,923,184 A | * | 7/1999 | Ooms et al. | 326/50 |
| 6,008,687 A | | 12/1999 | Orita et al. | |
| 6,194,952 B1 | * | 2/2001 | Shigehara | 327/534 |
| 6,469,564 B1 | * | 10/2002 | Jansen | 327/365 |
| 6,504,424 B1 | * | 1/2003 | Heminger et al. | 327/566 |
| 6,828,846 B2 | * | 12/2004 | Tsukazaki et al. | 327/404 |
| 2011/0057715 A1 | | 3/2011 | Guo | |

FOREIGN PATENT DOCUMENTS

| | | |
|---|---|---|
| CN | 102694534 A | 9/2012 |
| CN | 202872751 U | 4/2013 |
| JP | 0779145 A | 3/1995 |
| JP | 2006203362 A | 8/2006 |
| KR | 10-2012-0109382 | 10/2012 |

OTHER PUBLICATIONS

"Chinese Application Serial No. 201220131202.6, Office Action mailed Aug. 29, 2012", 2 pgs.
"Chinese Application Serial No. 201220131202.6, Response filed Oct. 26, 2012 to Office Action mailed Aug. 29, 2012", 17 pgs.
"Chinese Application Serial No. 201210092065.4, Office Action mailed Nov. 20, 2013", 7 pgs.

* cited by examiner

*Primary Examiner* — Kenneth B. Wells
(74) *Attorney, Agent, or Firm* — Schwegman Lundberg & Woessner, P.A.

(57) ABSTRACT

This document discusses, among other things, a switching device and method configured to receive a signal at a signal input, to provide the signal at an output in a first state without an applied voltage at a first control input, and to isolate the signal from the output in a second state with an applied voltage at the first control input. In an example, the switching device can include first, second, and third transistors, wherein the source of the first transistor is coupled to the drain of the second transistor and to the gate of the third transistor, wherein the signal input is coupled to the drain of the first transistor and to the drain of the third transistor, and wherein the output is coupled to the source of the third transistor.

23 Claims, 3 Drawing Sheets

INPUT •———105———[SWITCHING DEVICE]———• OUTPUT
• CONTROL

NO-POWER NORMALLY CLOSED ANALOG SWITCH

CLAIM OF PRIORITY

This application claims the benefit of priority under 35 U.S.C. §119(e) of Tony CH Lee et al. U.S. Provisional Patent Application Ser. No. 61/465,800, entitled "NO-POWER NORMALLY CLOSED ANALOG SWITCH," filed on Mar. 23, 2011, which is incorporated by reference herein in its entirety.

BACKGROUND

Electrical switches can be used to, among other things, selectively route signal paths to one or more locations, or to selectively open or close a conductive path by providing, in certain examples, a low resistance path when on and a high impedance path when off. However, many circuits distort or alter the signal passed between the input and the output, or require dedicated power to provide proper operation.

OVERVIEW

This document discusses, among other things, a switching device and method configured to receive a signal at a signal input, to provide the signal at an output in a first state without an applied voltage at a first control input, and to isolate the signal from the output in a second state with an applied voltage at the first control input. In an example, the switching device can include first, second, and third transistors, wherein the source of the first transistor is coupled to the drain of the second transistor and to the gate of the third transistor, wherein the signal input is coupled to the drain of the first transistor and to the drain of the third transistor, and wherein the output is coupled to the source of the third transistor.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a normally-closed switching device that does not require power or VCC to conduct received signals, such as analog audio signals. In an example, power for the switching device and control of the switching device can be integrated into a single input, or a single pin. Further, the switching device can conduct received signals, above or below ground, without clipping or cross-over distortion. Thus, in an example, the systems and methods described herein can allow high-fidelity audio and other signal pass-through functionality without applied power, which can significantly reduce power usage for conducting switches.

Figure 1:
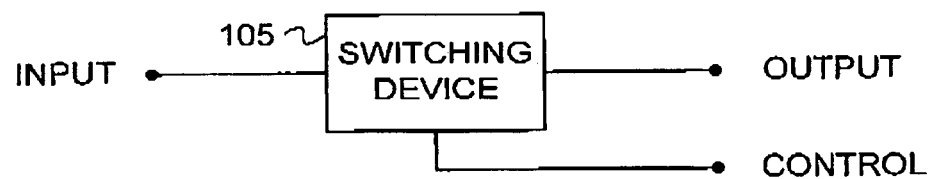
FIG. 1 illustrates generally an example switching device including a signal input, a first control input, and an output

FIG. 1 illustrates generally an example switching device 105 including a signal input, a first control input, and an output. In an example, the switching device 105 can be configured to receive a signal at a signal input and to provide or conduct the signal (or a representation of the signal) at an output in response to a ground signal (0V) or a floating signal received at the first control input. In an example, the switching device 105 can include a depletion mode negative-swing audio or other switch configured to allow signals to pass without the need for power or VCC. In an example, the input signal can include an audio signal, and the switching device 105 can be configured to provide the audio signal at the output, through the switching device 105, in response to the received ground or floating control signal. In an example, the switching device 105 can be powered and controlled using the first control input.

In an example, the switching device 105 can be configured to receive the signal at the signal input and to isolate or to not conduct the signal (or a representation of the signal) at an output in response to a negative voltage received at the first control input. In an example, because the switching device 105 only requires power to not conduct a received audio signal, the switching device 105, can require very low power. Further power can be saved by removing the negative voltage at the first control input when no signal is being received at the input. Further, in certain examples, when a negative voltage is applied to the first control input, opening the switching device 105, power loss can include gate leakage (e.g., picoamps, etc.) in one or more transistors in the switching device 105.

Figure 2:
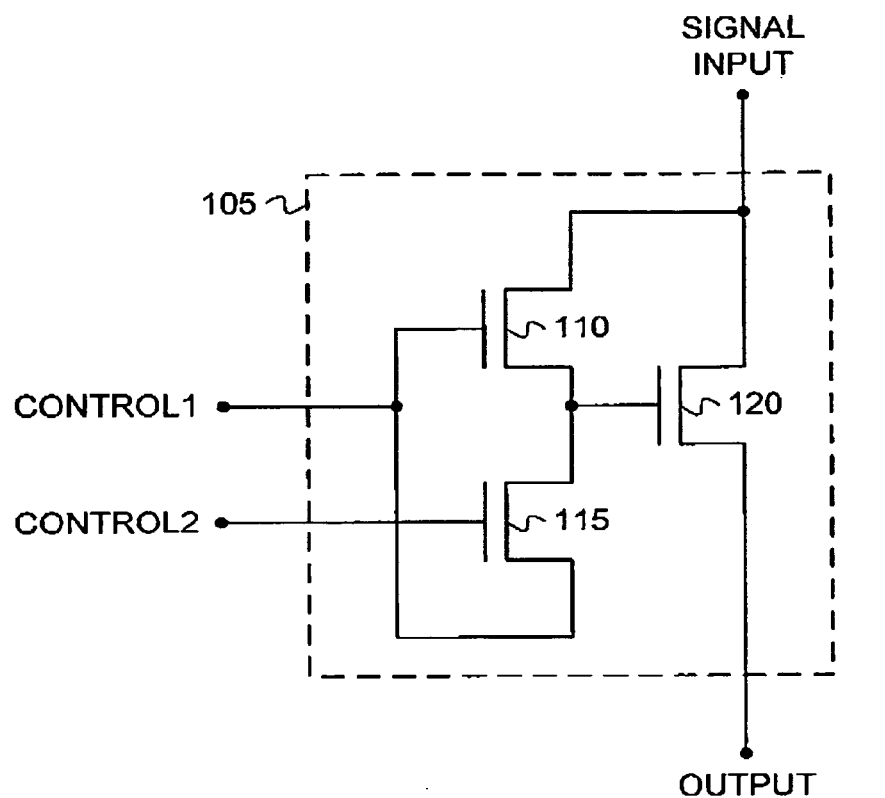
FIG. 2 illustrates generally an example switching device having first, second, and third transistors, a signal input, an output, and a first control input.

FIG. 2 illustrates generally an example switching device 105 having first, second, and third transistors 110, 115, 120, a signal input, an output, and a first control input (CONTROL1). In an example, a negative voltage can be applied to the first control input above a threshold to turn off or open the switching device 105. As a default, with no power applied to the first control input, the switching device 105 is on or closed.

In certain examples, the first transistor 110 can include an n-channel transistor, such as an n-channel metal-oxide-semiconductor field-effect transistor (MOSFET), an re-channel depletion mode MOSFET, an n-channel junction gate field-effect transistor (JFET), etc. In an example, the second transistor 115 can include an n-channel enhancement mode MOSFET, and the third transistor 120 can include an n-channel JFET. In other examples, other semiconductor devices can be used.

Figure 3A:
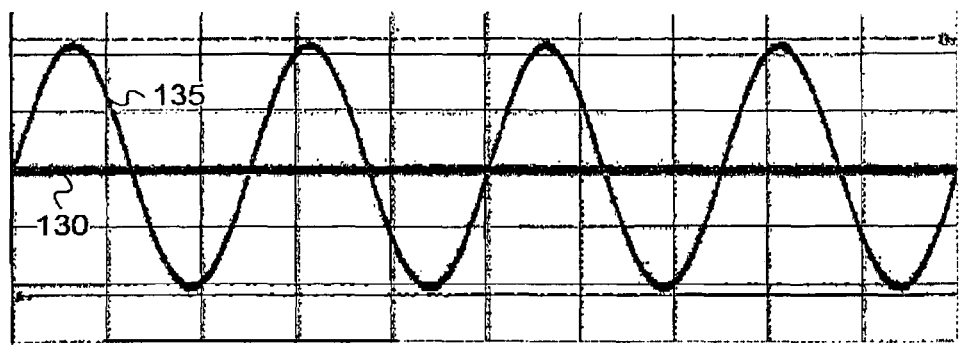
FIGS. 3A-3B illustrate generally examples of device output in response to received control signals.

In an example, an n-channel JFET only device can clip the output signal at the negative region of the signal range. However, the circuit described herein, such as illustrated in the example of FIG. 2, does not clip positive or negative polarity signals, as illustrated in the example of FIG. 3A. Further, in an example, the gate of the second transistor 115 (e.g., a second control input (CONTROL2)) can be held at ground or a voltage (e.g., a positive voltage, depending on the voltage level of the signal at the signal input) to ensure that the switching device 105 turns on when there is a voltage applied to the first control input. In an example, a ground signal (0V) can be applied to the gate of the second transistor 115.

In an example, during normal operation, the second control input can be tied to ground. However, depending on the capacitive coupling between the one or more transistors in the switching device 105 and the transient on the signal input, the second control input can be biased with a positive voltage to ensure that the third transistor 120 turns off in response to the control signal at the first control input.

FIG. 3A illustrates generally an example of an output signal 135 of a device in response to a control signal 130 being held at 0V, ground, or no power. In certain examples, an N-channel JFET only device will clip the signal at the negative region of the signal range. The circuit described here does not clip positive or negative polarity signals. As illustrated in the example of FIG. 3A, the device can provide full signal conduct at 0V, ground, floating signal, or no power at the first control input, including in the negative audio signal range, without clipping or cross-over distortion.

In the example of FIG. 3A, the output signal 135 illustrates a ±2.4V swing about ground, with the control signal 130 being held at ground.

Figure 3B:
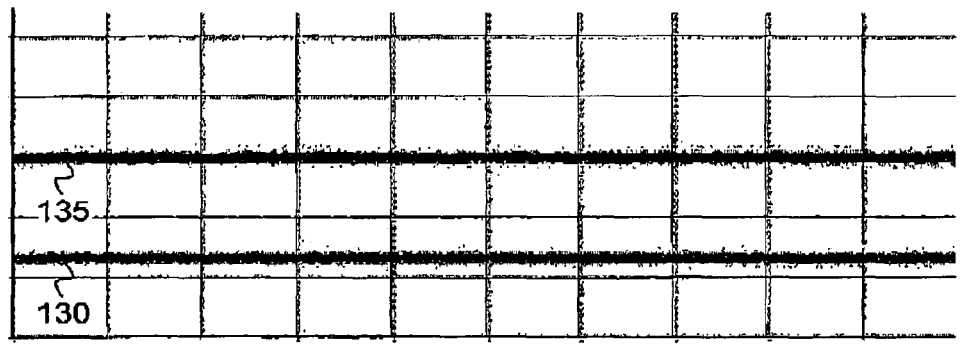

FIG. 3B illustrates generally an example of an output signal 135 of a device in response to a control signal 130 being held at a negative voltage great enough to turn off the switching device 105. In an example, the control signal 130 can include a voltage of −8.5V. In other examples, other thresholds can be used, greater or lower than −8.5V.

Figure 4:
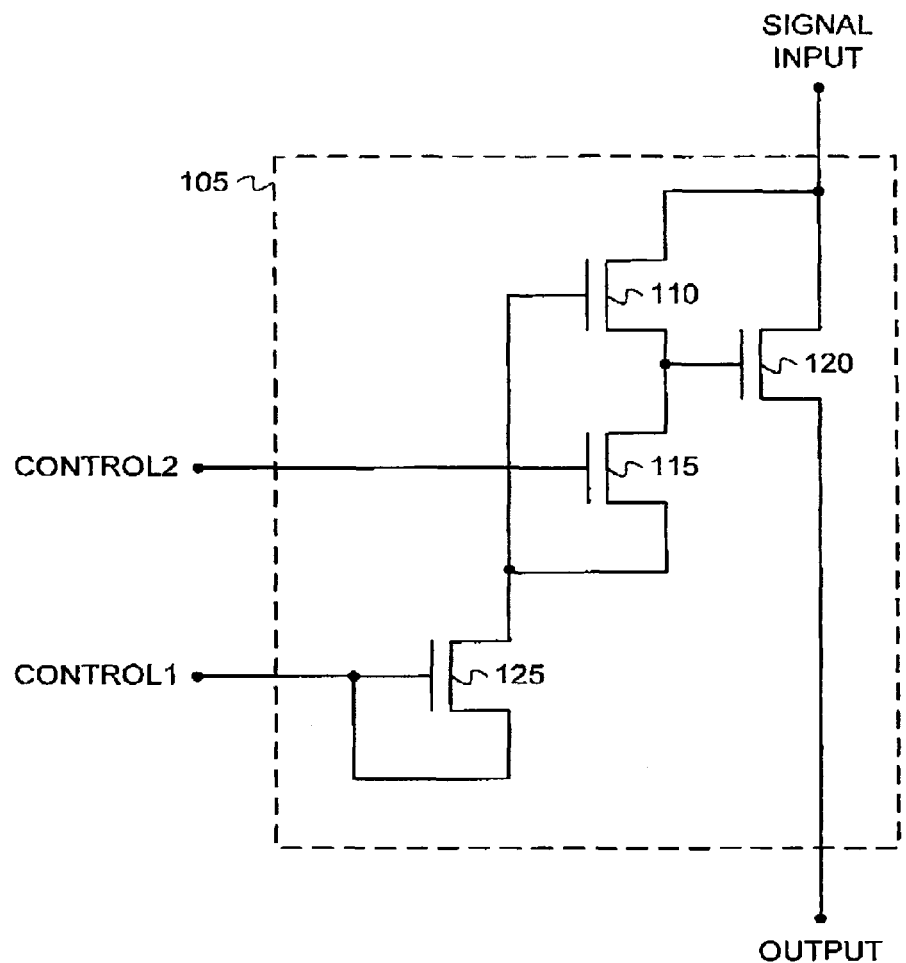
FIG. 4 illustrates generally an example switching device having first, second, third, and fourth transistors, a signal input, an output, and a first control input.

FIG. 4 illustrates generally an example switching device 105 having first, second, third, and fourth transistors 110, 115, 120, 125, a signal input, an output, and a first control input. In an example, a negative voltage can be applied to the first control input to turn the switch off or open the switch.

In certain examples, the example illustrated in FIG. 2 can clip a signal at the output, depending on voltage transients or the capacitance of the one or more transistors in the switching device 105. In an example, a positive voltage can be applied to the second control input (CONTROL2). In other examples, one or more other transistors (e.g., the fourth transistor 125) can be added to reduce clipping and ensure proper operation.

In certain examples, the first transistor 110 can include an n-channel depletion mode MOSFET, the second transistor 115 can include an n-channel enhancement mode MOSFET, the third transistor 120 can include an n-channel JFET, and the fourth transistor 125 can include an n-channel enhancement mode MOSFET. In other examples, other semiconductor devices can be used. In an example, the drain of the fourth transistor 125 can float when there is no power applied at the gate of the fourth transistor 125, reducing clipping of the output signal in comparison to the example of FIG. 2.

In an example, an integrated circuit (IC) can include a single switching device 105 having four pins: (1) signal input; (2) output; (3) the first control input; and (4) ground. In other examples, one or more other number of switches can be included in the IC having a multiple of the first three pins referenced above and one or more ground pins or no connection (NC) pins, or one or more other circuits, to fill out the IC. In certain examples, the IC can include one or more pins, example, for the second control input, etc.

Additional Notes

In Example 1, a switching device can include a signal input, a first control input, an output, and first, second, and third transistors, each including a gate, a drain, and a source, wherein the drain of the first transistor is coupled to the signal input, wherein the drain of the second transistor is coupled to the source of the first transistor, wherein the source of the second transistor is coupled to the gate of the first transistor, wherein the drain of the third transistor is coupled to the signal input, wherein the source of the third transistor is coupled to the output, wherein the gate of the third transistor is coupled to the source of the first transistor and to the drain of the second transistor, wherein the switching device is configured to receive a signal at the signal input, to provide the signal at the output in a first state without an applied voltage at the first control input, and to isolate the signal from the output in a second state with an applied voltage at the first control input.

In Example 2, the gate of the first transistor of Example 1 is optionally coupled to the first control input, and the source of the third transistor of Example 1 is optionally coupled to the first control input.

In Example 3, the switching device of any one or more of Examples 1-2 is optionally configured to receive an analog signal having components above and below ground at the signal input and to provide the analog signal at the output in the first state without an applied voltage at the first control input and without clipping the signal at the output.

In Example 4, the switching device of any one or more of Examples 1-3 is optionally configured to provide the signal at the output in the first state without an applied power to the switching device.

In Example 5, the switching device of any one or more of Examples 1-4 optionally includes the first control input, but does not include a separate power input.

In Example 6, the first control input of any one or more of Examples 1-5 is optionally configured to receive a negative voltage to isolate the signal from the output in the second state.

In Example 7, the first control input of any one or more of Examples 1-6 is optionally configured to receive a ground signal or a floating signal to provide the signal at the output in a first state without an applied voltage at the first control input.

In Example 8, the first transistor of any one or more of Examples 1-7 optionally includes a depletion mode metal-oxide-semiconductor field-effect transistor (MOSFET), the second transistor of any one or more of Examples 1-7 optionally includes an enhancement mode MOSFET, and the third transistor of any one or more of Examples 1-7 optionally includes a junction field-effect transistor (JFET).

In Example 9, the first transistor of any one or more of Examples 1-8 optionally includes a first n-channel metal-oxide-semiconductor field-effect transistor (MOSFET), the second transistor of any one or more of Examples 1-8 optionally includes a second n-channel MOSFET, and the third transistor of any one or more of Examples 1-8 optionally includes an n-channel junction gate field-effect transistor (JFET).

In Example 10, any one or more of Examples 1-9 optionally includes a second control input configured to receive a ground signal, and the gate of the second transistor of any one or more of Examples 1-9 is optionally coupled to the second control input.

In Example 11, any one or more of Examples 1-10 optionally includes a second control input, the gate of the second transistor of any one or more of Examples 1-10 is optionally coupled to the second control input, and the first control input of any one or more of Examples 1-10 is optionally configured to receive a negative voltage and the second control input is configured to receive a positive voltage to isolate the signal from the output in the second state when the magnitude of the input signal exceeds the magnitude of the first control input with respect to ground.

In Example 12, any one or more of Examples 1-11 optionally includes a fourth transistor including a gate, a drain, and a source, wherein the drain of the fourth transistor is optionally coupled to the gate of the first transistor and to the source of the second transistor, wherein the source of the fourth transistor is optionally coupled to the first control input, and wherein the gate of the fourth transistor is optionally coupled to the first control input.

In Example 13, the first transistor of any one or more of Examples 1-12 optionally includes an n-channel depletion mode metal-oxide-semiconductor field-effect transistor (MOSFET), the second transistor of any one or more of Examples 1-12 optionally includes an n-channel enhancement mode MOSFET, the third transistor of any one or more of Examples 1-12 optionally includes an n-channel junction field-effect transistor (JFET), and the fourth transistor of any one or more of Examples 1-12 optionally includes an n-channel enhancement mode MOSFET.

In Example 14, any one or more of Examples 1-13 optionally includes receiving a signal at a signal input of a switching device, receiving a first control signal at a first control input of the switching device, providing the signal received at the signal input to the output in a first state without an applied voltage at the first control input, and isolating the signal from the output in a second state with an applied voltage at the first control input, wherein the switching device includes first, second, and third transistors, each including a gate, a drain, and a source, wherein the drain of the first transistor is coupled to the signal input, wherein the drain of the second transistor is coupled to the source of the first transistor, wherein the source of the second transistor is coupled to the gate of the first transistor, and wherein the drain of the third transistor is coupled to the signal input, wherein the source of the third transistor is coupled to the output, and wherein the gate of the third transistor is coupled to the source of the first transistor and to the drain of the second transistor.

In Example 15, the gate of the first transistor of any one or more of Examples 1-14 is optionally coupled to the first control input, and the source of the third transistor of any one or more of Examples 1-14 is optionally coupled to the first control input.

In Example 16, the receiving the signal at the signal input of any one or more of Examples 1-15 optionally includes receiving an analog signal having components above and below ground at the signal input, and the providing the signal received at the signal input to the output in the first state of any one or more of Examples 1-15 optionally includes providing the analog signal at the output in the first state without an applied voltage at the first control input and without clipping the signal at the output.

In Example 17, the providing the signal at the output in the first state of any one or more of Examples 1-16 optionally includes without applying power to the switching device.

In Example 18, the receiving the first control signal at the first control input of any one or more of Examples 1-17 optionally includes without the switching device receiving a separate power supply.

In Example 19, the receiving the first control signal at the first control input of any one or more of Examples 1-18 optionally includes receiving a negative voltage, and the isolating the signal from the output in the second state of any one or more of Examples 1-18 optionally includes in response to the receiving the negative voltage at the first control input.

In Example 20, the receiving the first control signal at the first control input of any one or more of Examples 1-19 optionally includes receiving a ground signal or a floating signal, and the providing the signal received at the signal input to the output in the first state of any one or more of Examples 1-19 optionally includes in response to the receiving the ground signal or the floating signal.

In Example 21, the first transistor of any one or more of Examples 1-20 optionally includes an n-channel depletion mode metal-oxide-semiconductor field-effect transistor (MOSFET), the second transistor of any one or more of Examples 1-20 optionally includes an n-channel enhancement mode MOSFET, and the third transistor of any one or more of Examples 1-20 optionally includes an n-channel junction field-effect transistor (JFET).

In Example 22, any one or more of Examples 1-21 optionally includes receiving a ground signal at a second control input of the switching device, wherein the gate of the second transistor of any one or more of Examples 1-21 is optionally coupled to the second control input.

In Example 23, any one or more of Examples 1-22 optionally includes receiving a positive voltage at a second control input of the switching device, the gate of the second transistor of any one or more of Examples 1-22 is optionally coupled to the second control input, the receiving the first control signal at the first control input of any one or more of Examples 1-22 optionally includes receiving a negative voltage, and isolating the signal from the output in the second state of any one or more of Examples 1-22 optionally includes in response to the receiving the positive voltage at the second control input and the receiving the first control signal at the first control input.

In Example 24, the switching device of any one or more of Examples 1-23 optionally includes a fourth transistor including a gate, a drain, and a source, wherein the drain of the fourth transistor is optionally coupled to the gate of the first transistor and to the source of the second transistor, the source of the fourth transistor is optionally coupled to the first control input, and the gate of the fourth transistor is optionally coupled to the first control input.

In Example 25, the first transistor of any one or more of Examples 1-24 optionally includes an n-channel depletion mode metal-oxide-semiconductor field-effect transistor (MOSFET), the second transistor of any one or more of Examples 1-24 optionally includes an n-channel enhancement mode MOSFET, the third transistor of any one or more of Examples 1-24 optionally includes an n-channel junction field-effect transistor (JFET), and the fourth transistor of any one or more of Examples 1-24 optionally includes an n-channel enhancement mode MOSFET.

In Example 26, a system or apparatus can include, or can optionally be combined with any portion or combination of any portions of any one or more of Examples 1-25 to include, means for performing any one or more of the functions of Examples 1-25, or a machine-readable medium including instructions that, when performed by a machine, cause the machine to perform any one or more of the functions of Examples 1-25.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A switching device having a signal input, a first control input, and an output, the switching device comprising:
    a first transistor including a gate, a drain, and a source, wherein the drain of the first transistor is coupled to the signal input;
    a second transistor including a gate, a drain, and a source, wherein the drain of the second transistor is directly coupled to the source of the first transistor, and wherein the source of the second transistor is coupled to the gate of the first transistor; and
    a third transistor including a gate, a drain, and a source, wherein the drain of the third transistor is coupled to the signal input, wherein the source of the third transistor is coupled to the output, and wherein the gate of the third transistor is coupled to the source of the first transistor and to the drain of the second transistor,
    wherein the switching device is configured to receive a signal at the signal input, to provide the signal at the output in a first state without an applied voltage at the first control input, and to isolate the signal from the output in a second state with an applied voltage at the first control input.

2. The switching device of claim 1, wherein the gate of the first transistor is coupled to the first control input, and
    wherein the source of the second transistor is coupled to the first control input.

3. The switching device of claim 1, wherein the switching device is configured to receive an analog signal having components above and below ground at the signal input and to provide the analog signal at the output in the first state without an applied voltage at the first control input and without clipping the signal at the output.

4. The switching device of claim 1, wherein the first control input is configured to receive a negative voltage to isolate the signal from the output in the second state.

5. The switching device of claim 1, wherein the first control input is configured to receive a ground signal or a floating signal to provide the signal at the output in a first state without an applied voltage at the first control input.

6. The switching device of claim 1, wherein the first transistor includes a depletion mode metal-oxide-semiconductor field-effect transistor (MOSFET),
    wherein the second transistor includes an enhancement mode MOSFET, and
    wherein the third transistor includes a junction field-effect transistor (WET).

7. The switching device of claim 1, wherein the first transistor includes a first re-channel metal-oxide-semiconductor field-effect transistor (MOSFET),
    wherein the second transistor includes a second n-channel MOSFET, and
    wherein the third transistor includes an n-channel junction gate field-effect transistor (JFET).

8. The switching device of claim 1, including:
    a second control input configured to receive a ground signal,
    wherein the gate of the second transistor is coupled to the second control input.

9. The switching device of claim 1, including:
    a second control input;
    wherein the gate of the second transistor is coupled to the second control input, and
    wherein the first control input is configured to receive a negative voltage and the second control input is configured to receive a positive voltage to isolate the signal from the output in the second state when the magnitude of the input signal exceeds the magnitude of the first control input with respect to ground.

10. The switching device of claim 1, including:
a fourth transistor including a gate, a drain, and a source, wherein the drain of the fourth transistor is coupled to the gate of the first transistor and to the source of the second transistor, wherein the source of the fourth transistor is coupled to the first control input, and wherein the gate of the fourth transistor is coupled to the first control input.

11. The switching device of claim 10, wherein the first transistor includes an n-channel depletion mode metal-oxide-semiconductor field-effect transistor (MOSFET),
wherein the second transistor includes an n-channel enhancement mode MOSFET,
wherein the third transistor includes an n-channel junction field-effect transistor (JFET), and
wherein the fourth transistor includes an n-channel enhancement mode MOSFET.

12. A switching method, including:
receiving a signal at a signal input of a switching device;
receiving a first control signal at a first control input of the switching device;
providing the signal received at the signal input to an output in a first state without an applied voltage at the first control input; and
isolating the signal from the output in a second state with an applied voltage at the first control input,
wherein the switching device includes first, second, and third transistors, each including a gate, a drain, and a source,
wherein the drain of the first transistor is coupled to the signal input,
wherein the drain of the second transistor is directly coupled to the source of the first transistor, wherein the source of the second transistor is coupled to the gate of the first transistor, and
wherein the drain of the third transistor is coupled to the signal input, wherein the source of the third transistor is coupled to the output, and wherein the gate of the third transistor is coupled to the source of the first transistor and to the drain of the second transistor.

13. The switching method of claim 12, wherein the gate of the first transistor is coupled to the first control input, and
wherein the source of the second transistor is coupled to the first control input.

14. The switching method of claim 12, wherein the receiving the signal at the signal input includes receiving an analog signal having components above and below ground at the signal input, and
wherein the providing the signal received at the signal input to the output in the first state includes providing the analog signal at the output in the first state without an applied voltage at the first control input and without clipping the signal at the output.

15. The switching method of claim 12, wherein the providing the signal at the output in the first state includes without applying power to the switching device.

16. The switching method of claim 12, wherein the receiving the first control signal at the first control input includes without the switching device receiving power separate from the first control signal.

17. The switching method of claim 12, wherein the receiving the first control signal at the first control input includes receiving a negative voltage, and
wherein the isolating the signal from the output in the second state includes in response to the receiving the negative voltage at the first control input.

18. The switching method of claim 12, wherein the receiving the first control signal at the first control input includes receiving a ground signal or a floating signal, and
wherein the providing the signal received at the signal input to the output in the first state includes in response to the receiving the ground signal or the floating signal.

19. The switching method of claim 12, wherein the first transistor includes an n-channel depletion mode metal-oxide-semiconductor field-effect transistor (MOSFET),
wherein the second transistor includes an n-channel enhancement mode MOSFET, and
wherein the third transistor includes an n-channel junction field-effect transistor (JFET).

20. The switching method of claim 12, including:
receiving a ground signal at a second control input of the switching device,
wherein the gate of the second transistor is coupled to the second control input.

21. The switching method of claim 12, including:
receiving a positive voltage at a second control input of the switching device,
wherein the gate of the second transistor is coupled to the second control input,
wherein the receiving the first control signal at the first control input includes receiving a negative voltage, and
wherein isolating the signal from the output in the second state includes in response to the receiving the positive voltage at the second control input and the receiving the first control signal at the first control input.

22. The switching method of claim 12, wherein the switching device includes a fourth transistor including a gate, a drain, and a source, and
wherein the drain of the fourth transistor is coupled to the gate of the first transistor and to the source of the second transistor, wherein the source of the fourth transistor is coupled to the first control input, and wherein the gate of the fourth transistor is coupled to the first control input.

23. The switching method of claim 22, wherein the first transistor includes an n-channel depletion mode metal-oxide-semiconductor field-effect transistor (MOSFET),
wherein the second transistor includes an n-channel enhancement mode MOSFET,
wherein the third transistor includes an n-channel junction field-effect transistor (JFET), and
wherein the fourth transistor includes an n-channel enhancement mode MOSFET.

* * * * *